United States Patent [19]

Warner, Jr. et al.

[11] Patent Number: 4,794,442
[45] Date of Patent: Dec. 27, 1988

[54] THREE-DIMENSIONAL INTEGRATED CIRCUIT

[75] Inventors: Raymond M. Warner, Jr., Edina; Ronald D. Schrimpf, St. Paul, both of Minn.; Alfons Tuszynski, San Diego, Calif.

[73] Assignee: Regents of the University of Minnesota, Minneapolis, Minn.

[21] Appl. No.: 799,652

[22] Filed: Nov. 19, 1985

[51] Int. Cl.$^4$ .................. H01L 27/02; H01L 29/80; H01L 29/88

[52] U.S. Cl. ........................ 357/41; 357/22; 357/12; 357/44

[58] Field of Search ............. 357/41, 22 D, 12, 44

[56] References Cited

U.S. PATENT DOCUMENTS 4,412,239 10/1983 Iwasaki et al. .................. 357/44
4,638,344 1/1987 Cardwell, Jr. .................. 357/22 D

OTHER PUBLICATIONS

Transistors, Warner and Grung, pp. 64–67, Wiley, New York, 1983.
Device Modeling for Advanced Integrated Circuits, A Thesis Submitted to the Faculty of the Graduate School of the University of Minnesota, by Dong-Hyuk Ju, Jul., 1984.
A Feasibility Study of Devices for Three-Dimensional Integrated Circuits, A Thesis Submitted to the Faculty of the Graduate School of the University of Minnesota, by Ronald David Schrimpf.

Primary Examiner—Martin H. Edlow
Assistant Examiner—Robert P. Limanek
Attorney, Agent, or Firm—Hugh D. Jaeger

[57] ABSTRACT

A single-crystal monolith containing a 3-D doping pattern forming varied devices and circuits that are junction-isolated. The semiconductor monolith includes interconnecting signal paths and power buses, also junction-isolated, usually with N+ regions within P matrix regions, and tunnel junctions, N+-P+ junctions, as ohmic contacts from N-type to P-type regions. An isolating box incorporates an orthogonal isolator. The 3-D structure places layers of critical profile normal to the growth axis. The orthogonal isolator can include floating elements. The 3-D semiconductor monolith can be manufactured through continuous or quasicontinuous processing in a closed system, such as through MBE or sputter epitaxy.

26 Claims, 9 Drawing Sheets

THREE-DIMENSIONAL INTEGRATED CIRCUIT

BACKGROUND OF THE DISCLOSURE

A single-crystal all-semiconductor monolith containing a 3-D doping pattern forming varied devices and circuits that are junction-isolated. The semiconductor monolith includes interconnecting signal paths and power buses, also junction-isolated, usually with N+ regions within P matrix regions, and tunnel junctions, N+-P+ junctions, as ohmic contacts from N-type to P-type regions. An isolating box incorporates an orthogonal isolator. The 3-D structure places layers of critical profile normal to the growth axis. The orthogonal isolator can include floating elements. The 3-D semiconductor monolith can be manufactured through continuous or quasicontinuous processing in a closed system, such as through MBE or sputter epitaxy. The result is known as an all-semiconductor three-dimensional integrated circuit (AS3DIC).

BACKGROUND OF THE INVENTION

1. Field of the Invention

The present invention pertains to an all-semiconductor 3-D integrated circuit (AS3DIC), and more particularly, pertains to a single-crystal semiconductor monolith containing a 3-D doping pattern forming varied devices and circuits that are junction-isolated and with interconnecting signal paths and power buses, also junction-isolated, and with tunnel junctions connecting N-type to P-type regions.

2. Description of the Prior Art

The prior art, such as stacked CMOS, has been concerned with patterning and contouring various materials on the surfaces of semiconductor wafers by using a variety of techniques as a means of achieving more than one layer of circuitry on a substrate.

Prior work in three dimensions has been applied mainly to stacked devices, mostly CMOS, and circuits achieved by complex but largely conventional technologies. The motivation was to have the convenience of insulators for isolation and metals for electrical conduction while taking limited advantage of the third dimension. Numerous problems remain. First, there are reliability penalties because of the interfaces involved. Second and third, there are additional reliability and yield penalties connected with the necessary storage and handling. Fourth, there is the thermal-conductivity penalty. Because power dissipation is already a problem in 2-dimensional circuitry, power dissipation is a greater problem in 3-dimensional circuitry and must be accounted for accordingly. The prior-art stacked approach also included problems of adequate crystalline quality and control, and achieving adequate planarity in the advancing free surface. Stacking of largely conventional devices has been nothing more than an evolutionary extension of the existing prior-art processes in stacking planes separated by an insulator and involving recrystallized material.

The present invention overcomes the disadvantages of the prior art by providing an all-semiconductor 3-dimensional integrated circuit in a single-crystal semiconductor monolith with no metals or insulators inside. At a given feature size, the 3-dimensional IC provides for greatly increased volumetric densities, as well as improved reliability. Reliability is enhanced by the elimination of interfaces between dissimilar materials. Thermal properties are improved by the exclusion of insulating material from within the monolith. An insulator, such as silicon dioxide, has thermal conductivity one hundred times worse than that of silicon. Furthermore, an all-semiconductor three-dimensional integrated circuit can be fabricated in a continuous process which minimizes the number of different processing steps and reduces turnaround time.

SUMMARY OF THE INVENTION

The general purpose of the present invention is an all-semiconductor 3-dimensional integrated circuit (AS3DIC) which includes a single-crystal semiconductor monolith with no metals or insulators inside, and containing a 3-D doping pattern forming varied devices and circuits that are junction-isolated and with interconnecting semiconductor signal paths and power buses, also junction-isolated, usually N+ within P matrix regions, and tunnel junctions (N+-P+ junctions) as ohmic contacts from N-type to P-type regions. The matrix may contain a network of P+ to reduce its overall resistance. The only metal-semiconductor contacts are at the outer surfaces. Devices of the present invention are isolated by an isolating box that surrounds the active portion of the device. The box places back-to-back junctions between the device and the matrix material. To avoid shorting out a device, it may be necessary to interrupt the walls of the box with a thin gap that is normally depleted, the gap constituting another case of back-to-back junctions. this gap provides isolation between the top and bottom of the box and between the inside and outside of the box, thus providing orthogonal isolation.

According to one embodiment of the present invention, there is provided an all-semiconductor 3-dimensional integrated circuit comprising at least one semiconductor circuit including at least one active device and semiconductor material entirely surrounding the circuit with a semiconductor matrix in a three-dimensional space about the semiconductor circuit.

One significant aspect and feature of the present invention is an all-semiconductor three-dimensional integrated circuit which includes optimized path lengths, functional density, and reliability.

Another significant aspect and feature of the present invention is an isolating box incorporating an orthogonal isolator for the semiconductor component or components. The orthogonal isolator can also include floating elements between its major members.

A further significant aspect and feature of the present invention is a device structure that places layers of critical profile normal to the growth axis, the growth axis being identified as the "X" axis.

An additional significant aspect and feature of the present invention is a 3-dimensional IC which lends itself to continuous or quasicontinuous processing.

Having thus described the embodiments of the present invention, it is the principal object hereof to provide an all-semiconductor, 3-dimensional integrated circuit (AS3DIC).

Objects of the present invention include a single-crystal semiconductor monolith with no metals or insulators inside, but containing a three-dimensional doping pattern, forming varied devices and circuits that are junction-isolated and with interconnecting signal paths and power buses, also junction isolated, and tunnel junctions as ohmic contacts from N-type to P-type regions. The semiconductor crystal also includes isolating boxes incorporating orthogonal isolators. The semiconductor structure places layers of critical profile normal to the growth access. The orthogonal isolator can also include floating elements. When the semiconductor device employed is the JFET, it can also include an internal gate or gates, with the back-to-back junctions of the adjacent channel separating the gate from the surrounding matrix. There can also be box isolation of the internal-gate devices. Further, there can be pinch-off isolation, at the edge of an internal gate, involving back-to-back junctions as an internal gate thin enough so that the region between the upper and lower channels is normally depleted, as well as orthogonal isolation of the gate edge using U-shaped cross-section regions of same type as channels regions wrapped around the gate-channel edges to provide orthogonal isolation. The semiconductor monolith can also be provided with a coaxial conductor or with one or more conductors within a larger conductor, where here and in the following discussion, "conductor" is construed to mean a heavily doped semiconductor region that simulates metallic properties. Finally, the semiconductor monolith lends itself to specific three-dimensional circuit embodiments. The entire semiconductor monolith can be made through a continuous processing or quasicontinuous processing procedure.

DESCRIPTION OF THE PREFERRED EMBODIMENTS

Figure 1:
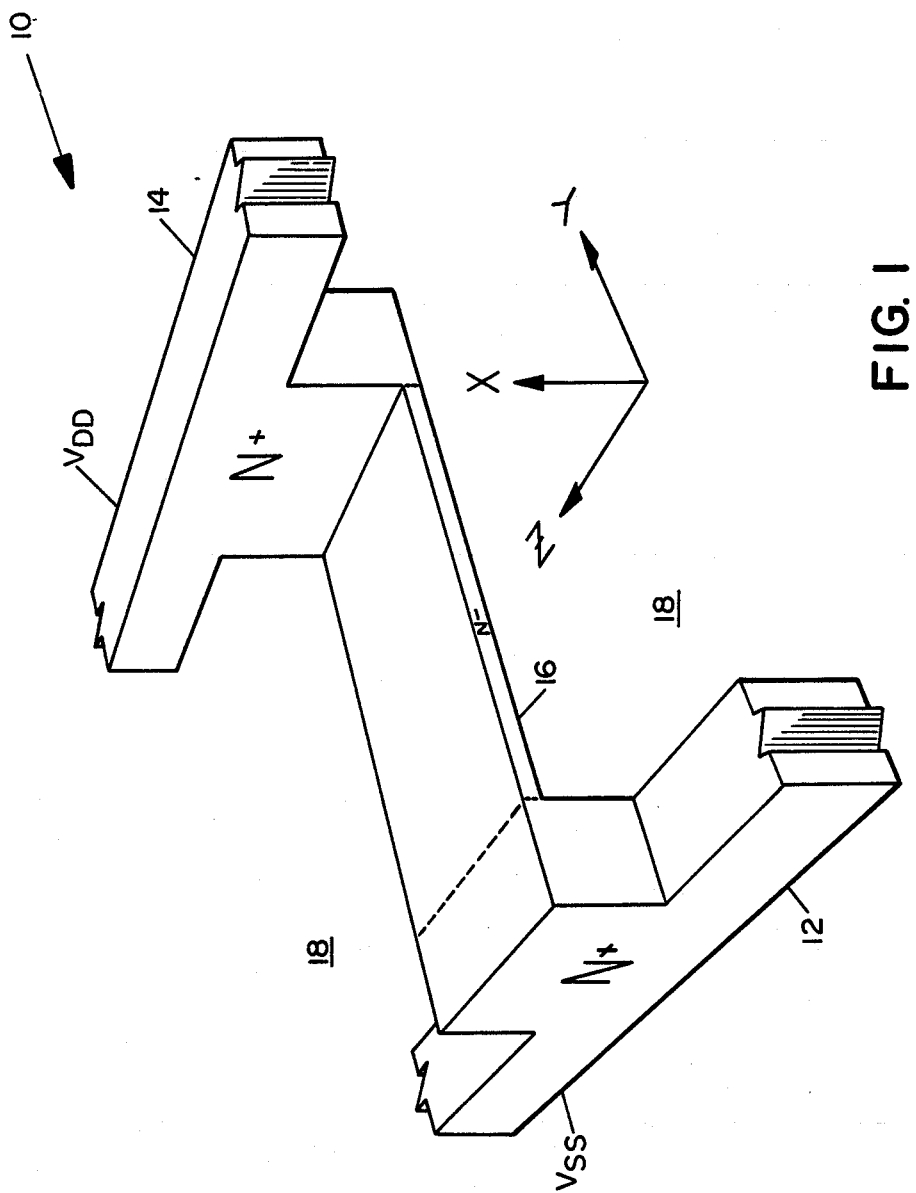
FIG. 1 illustrates a perspective view of a field effect diode.

FIG. 1 illustrates a perspective view of a current-regulating diode device 10 connecting to N+-region conductors 12 and 14. A thin N− region 16 is the channel of the device 10. All of these N-type regions 12–16 are surrounded by a matrix of P− material 18, treated as invisible for sake of brevity and clarity in the figure. All space is P-matrix material, except for those regions which have been numbered. The N+ region 14 is connected to $V_{DD}$ and the N+ region 12 is connected to $V_{SS}$. The elements 12 and 14 can also be referred to as conductors. With voltage applied as indicated, the upper N+ region 14 is isolated from the matrix by a reverse-biased junction, that reverse-biased junction being wherever the region 14 comes into contact with the surrounding P region. The same is applicable to the channel region 16 with reverse bias diminishing as the lower conductor 12 is approached. The largest reverse bias is in region 14, while the smallest reverse bias is at region 12. The device 10 is structured so that the layers having a critical profile are placed normal to the growth axis X.

Figure 2:
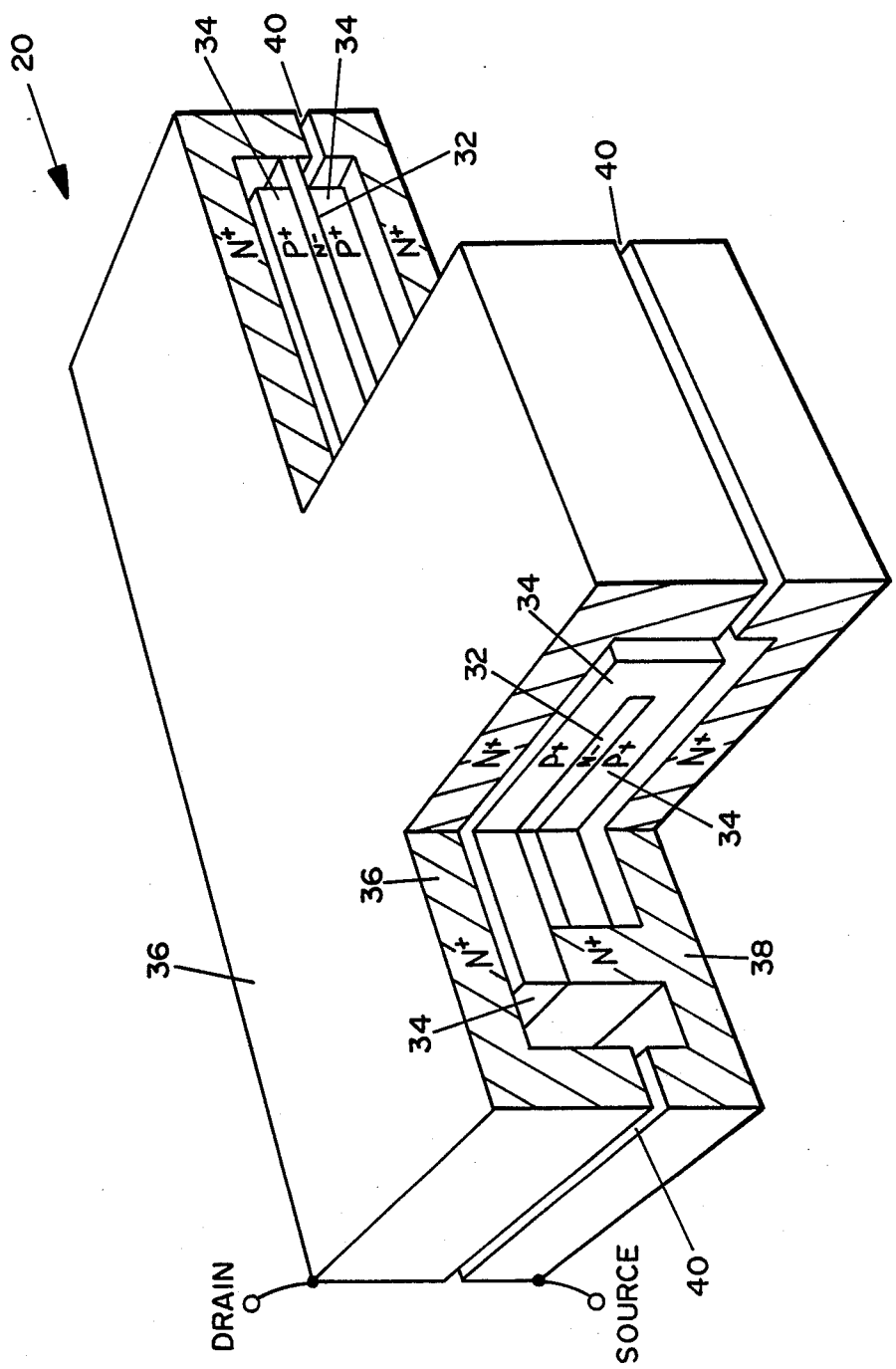
FIG. 2 illustrates a perspective cutaway view of a field-effect diode load device useful in an all-semiconductor three-dimensional integrated circuit (AS3DIC)

FIG. 2 illustrates a perspective cutaway view of an all-semiconductor, 3-dimensional integrated device 20, configured as a field-effect diode load device. An N− channel 32 is surrounded by a gate 34 of P+ material. The regions 32 and 34 are also continuous towards the right-hand side of the figure. The regions 32 and 34 are the active parts of the device. The active part of the device is isolated by the top part of the box, N+ material 36 and the bottom part of the box, N+ material 38. The N− material 32 connects the lower portion of the box 38 to the upper portion of the box 36. The N+ layers of material 36 and 38 form the isolation box. Gaps 40, which are formed by back-to-back junctions and are continuous about the device, provide for orthogonal isolation. The layers 32 and 34 are suspended within the box and surrounded by P matrix material which has not been labeled on the figure for purposes of clarity and for the sake of brevity in the figure.

Figure 3:
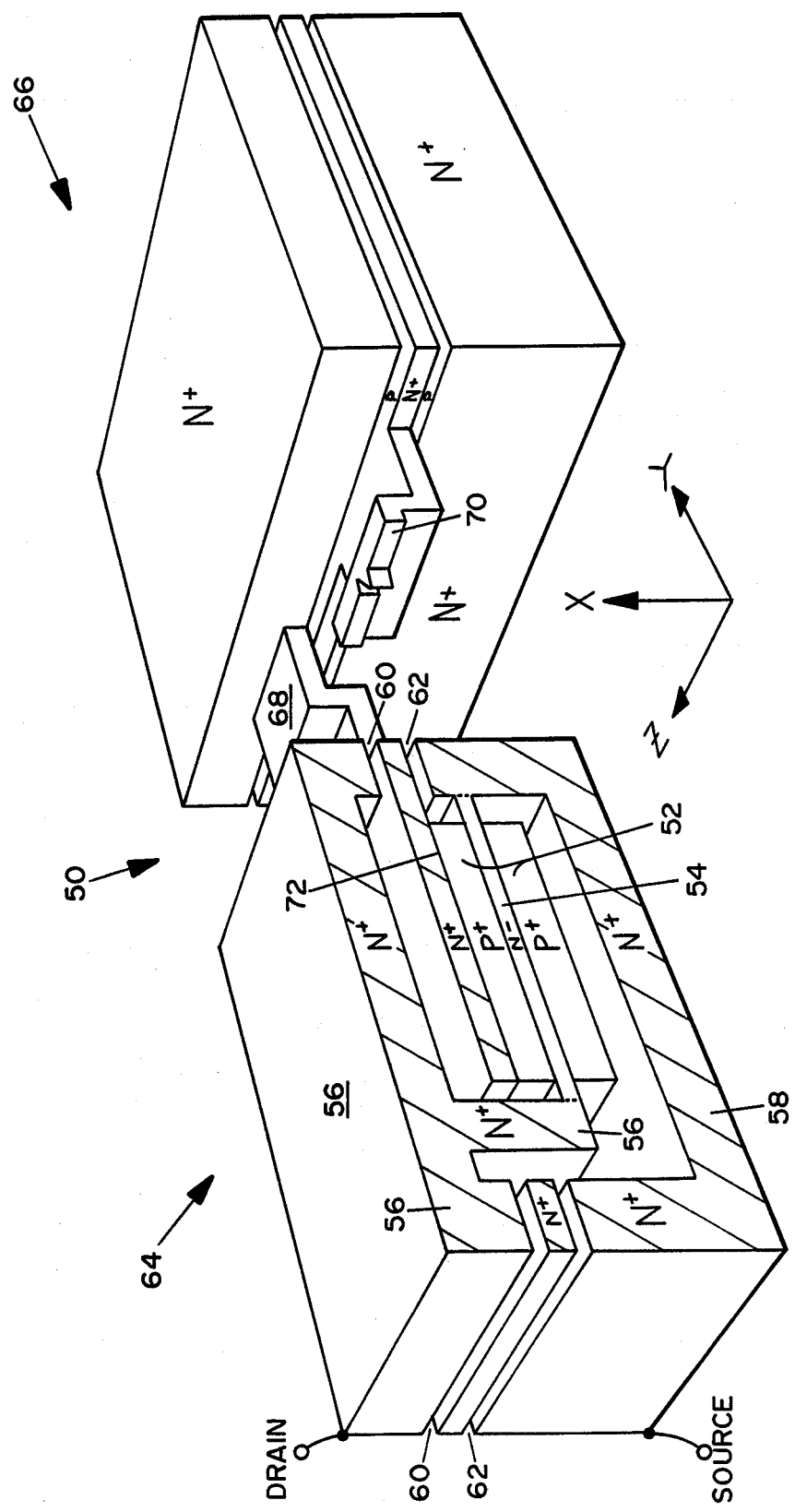
FIG. 3 illustrates a perspective cutaway view of a cross-coupled E-mode JFET pair.

FIG. 3 illustrates a perspective view of a pair of cross-coupled E-mode JFETs partially cut-away. Reference will be subsequently made to FIG. 4 of an Eccles-Jordon flip-flop constructed of enhancement-mode and depletion-mode JFETS. If the P+ region were extended out of the paper, the P+ region 52 would wrap around the end portion of the N-region 54. In this particular embodiment, two gaps are provided, 60 and 62, which provide for penetrating through the box wall for the cross-coupling elements 68 and 70. P matrix material fills the gaps and has not been illustrated for purposes of clarity and brevity in the figure. The left-hand box 64 of FIG. 3 represents transistor E1 of FIG. 4, and the right hand box 66 of FIG. 3 illustrates the right-hand transistor E2. The layers 68 and 70 provide for cross-coupling accordingly. The junction of the N+ and P+ layers represents a tunnel junction 72. Cross-coupling elements 68 and 70 represent interconnecting signal paths. The FIG. particularly shows layers of critical profile normal to the growth axis X. End layers 56 and 58 illustrate the isolating box, as well as the N+ layers of the left-hand side of FIG. 3.

Figure 4:
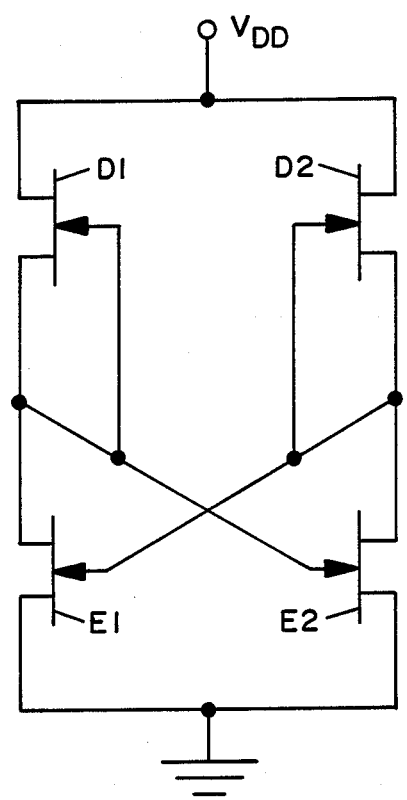
FIG. 4 illustrates an Eccles-Jordan flip-flop constructed of enhancement-mode and depletion-mode JFETS.

FIG. 4 illustrates the electrical circuit schematic for an Eccles-Jordan flip-flop constructed of enhancement-mode JFETs, E1 and E2, and depletion-mode JFETs, D1 and D2. FIG. 3 represents the physical embodiment of the two E-mode JFETs, E1 and E2, in FIG. 4 where all numerals correspond to those elements previously described. The devices of FIGS. 1–4 can be constructed by a single process and within a single processing vessel.

In operation, multilayer JFET-channel devices for the purpose of achieving high transconductance are particularly advantageous because the X dimensions in the isolating box are only slightly increased by increasing the number of channel layers.

Additional features of the devices can include doped regions which consist of a plurality of fractional atomic planes of dopant atoms which can be deposited through a shadow mask. The structure lends itself to a minimal number of metal-semiconductor and dissimilar-material interfaces which are required to implement a desired structure. Of course, all critical dimensions are normal to the growth axis. Junction isolation is provided by the arrangement of the materials themselves. Tunnel junctions as ohmic contacts are provided from N-type to P-type regions. When upper and lower gates are common in an enhancement-mode JFET, the device is useful as a driver. In a JFET with upper and lower gates independent of each other, the punch-through voltage from gate to gate yields a constant-voltage I-V characteristic, useful for level shifting in the AS3DIC. In the third, or orthogonal-isolator application, there must be a high enough punch-through voltage in the JFET so as to provide useful gate-to-gate isolation below that value, while simultaneously providing source-to-drain isolation in the orthogonal direction through the normally depleted channel, which provides the orthogonal isolation. A floating element can be introduced into the JFET channel region and between the gate regions, thus increasing the punch-through voltage and thus providing a greater isolating voltage. A JFET with one or more additional floating elements introduced into the channel region and between the gate region, increases the punch-through voltage and thus the isolating voltage. When such a JFET is incorporated into an isolating box that surrounds at least one component of the AS3DIC in such a way that one gate is common with the box lid and the other gate is common with the bottom of the box, the dual-gate E-mode JFET is continuous around the periphery of the box, thus achieving simultaneous top-to-bottom isolation and inside-to-outside isolation. When there is at least one additional element lying between the gates and extending around the entire periphery of the box of the JFET, it is thus possible to provide a direct connection of an element inside the box to an element outside the box without loss of the orthogonal isolation.

In an internal-gate JFET, the channel surrounds the gate region, or lies on both sides of it. In a JFET with a gate region between two channel regions, two regions of the same-type material as the channel wrapped around the side eges of the channel-gate structure can provide for orthogonal isolation of the gate region from the surrounding matrix, while also enabling the gate to modulate the conductivity of the entire channel. This is referred to as edge isolation. Another form of edge isolation is called pinch-off isolation. In this case, the gate is thin and the two channel layers extend laterally beyond it, with complete depletion existing between the extending channel layers so that the gate region is isolated from the matrix.

All-depletion-mode circuits can include level shifting by providing a gap in a conductor so that the punch-through phenomena will occur by E-mode devices. The E-mode JFET structure lends itself particularly to orthogonal isolation, exhibits punch through for voltage regulation and level shifting, and provides that the device can be used as an E-mode JFET driver.

Figure 5:
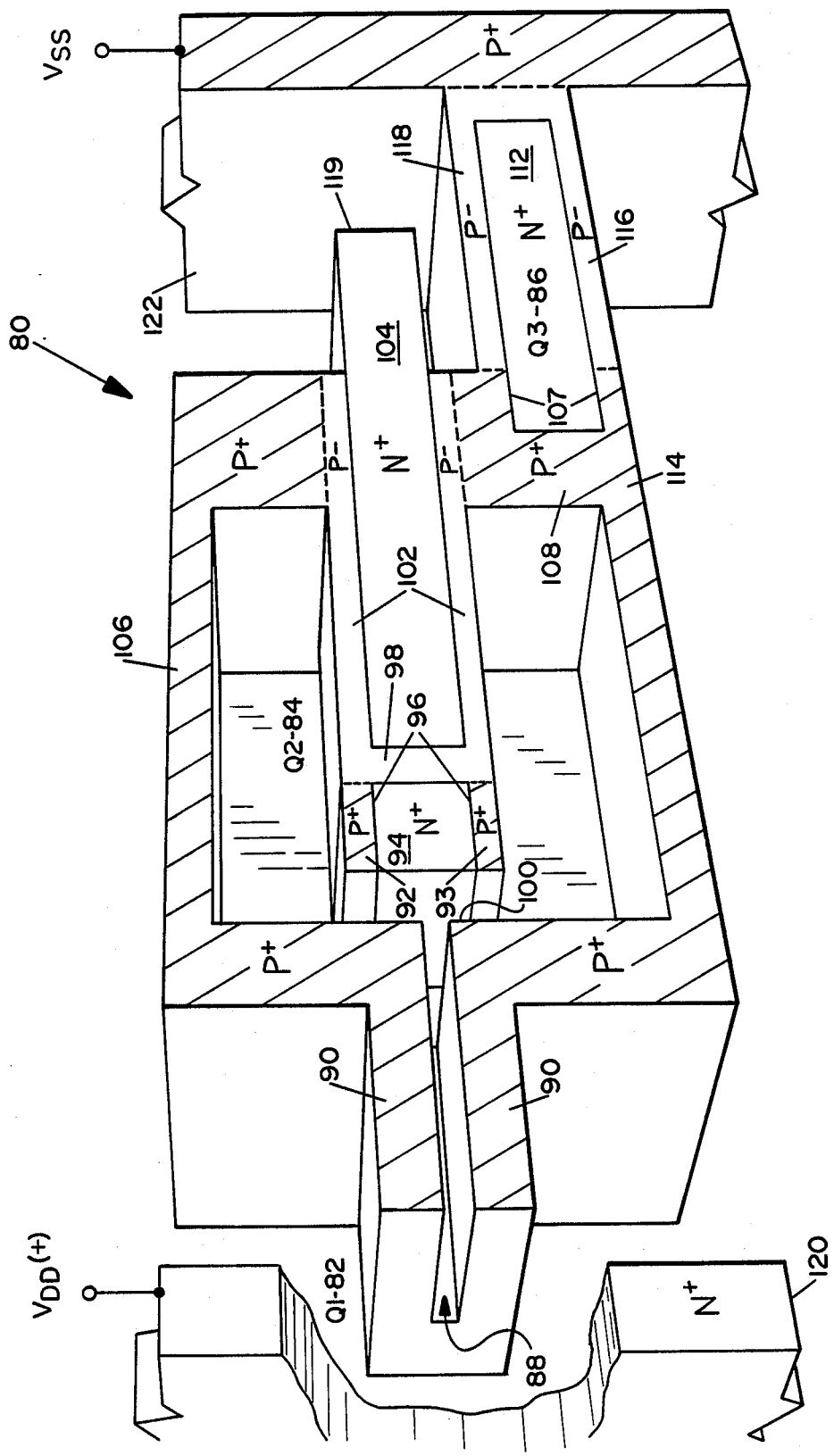
FIG. 5 illustrates a perspective cutaway view of a complementary JFET bistable circuit.
Figure 6:
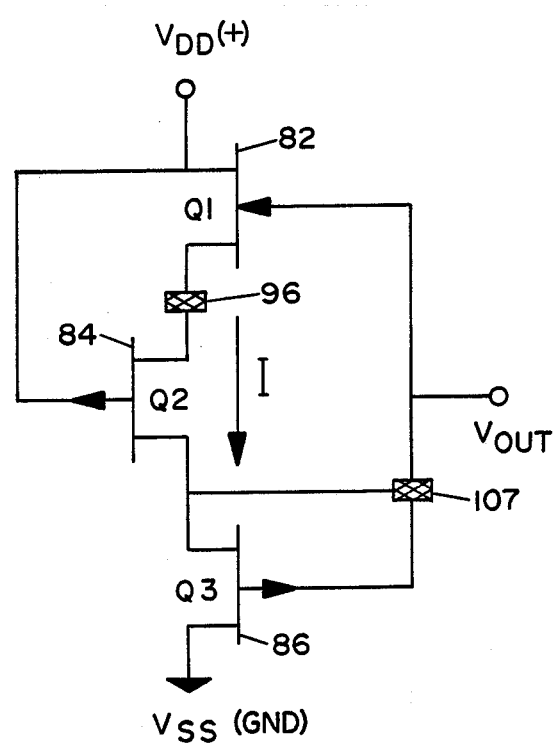
FIG. 6 illustrates a circuit diagram of FIG. 5.

FIG. 5 illustrates a perspective cutaway view of a negative-resistance memory cell 80 without the read or write capabilities. The cell 80 corresponds to the electrical circuit of FIG. 6. The cell 80 includes three different transistors Q1-82, Q2-84, and Q3-86. Transistors Q1 and Q2 form a negative-resistance pair. Transistor Q3 is a depletion-mode load device. This, contrary to the previous figures, illustrates an N-type matrix where the N-type material is invisible for purposes of clarification and sake of brevity in the drawing. The N channel 88 of Q1 is surrounded by P region 90 which is continuous and is symmetric in the plane in which it is cleaved. The P+ regions 92 and 93 and N+ region 94, respectively, illustrate tunnel junctions as ohmic contacts. The tunnel junctions 96 are illustrated in FIG. 6. The N+ region 94 is common with the N material inside of the box of Q2. Region 98 corresponds to the source of Q2. The end of the channel, as well as the region about 100, corresponds to the source of transistor Q1. The thin channel 102 is the active part of transistor Q2 and illustrates the internal gate of Q2. N+ region 104 is an internal gate. A thin P-type region 102 surrounds the N+ region 104. P material 106, a continuation of P material 90, forms a box about the P+ 92, N+ 94 and the N+ 104 material accordingly. The box is designated as 106, but is not shown in totality for purposes of illustration and clarity in the drawings. The region of the P material 90 which surrounds the channel 88 is the gate of Q1. A tunnel junction 107 is formed by the P+ 108 region and the N+ region 112. The gate region 112 is electrically common to a drain region 114 through the tunnel junction, and through the path of P+ 108 and N+ 112 through the tunnel junction 107. The P− region, including channels 116 and 118, wraps around and surrounds the internal gate 112. The end of N+ region 104, that end designated as 119, is at the same potential as a power bus 120, that potential being $V_{DD}$. The P+ region 122 is a bus region. The regions 92 and 94 can be grown side-by-side in lieu of the stacked configuration as illustrated in the figure.

FIG. 6 illustrates a circuit diagram of FIG. 5 where all numerals correspond to those elements previously described.

Figure 7:
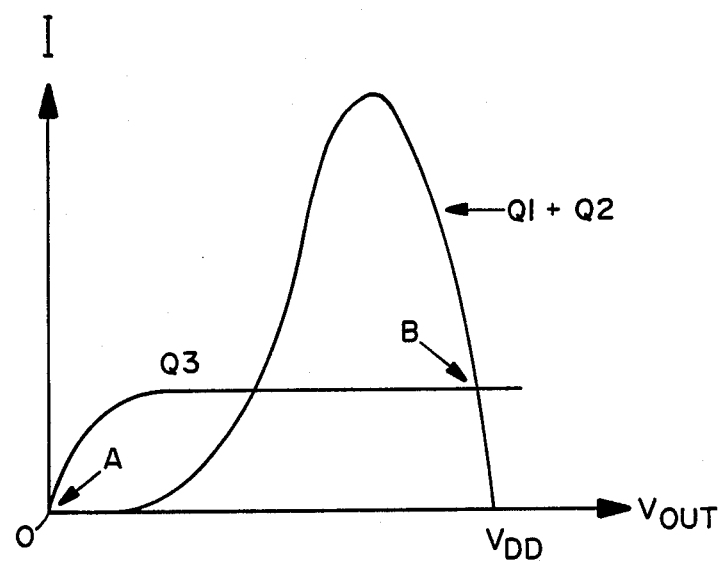
FIG. 7 illustrates an I-V plot of FIG. 6.

FIG. 7 illustrates an I-V diagram of the operation of FIGS. 5 and 6. Points A and B are the voltage-stable points for the circuit.

Figure 8:
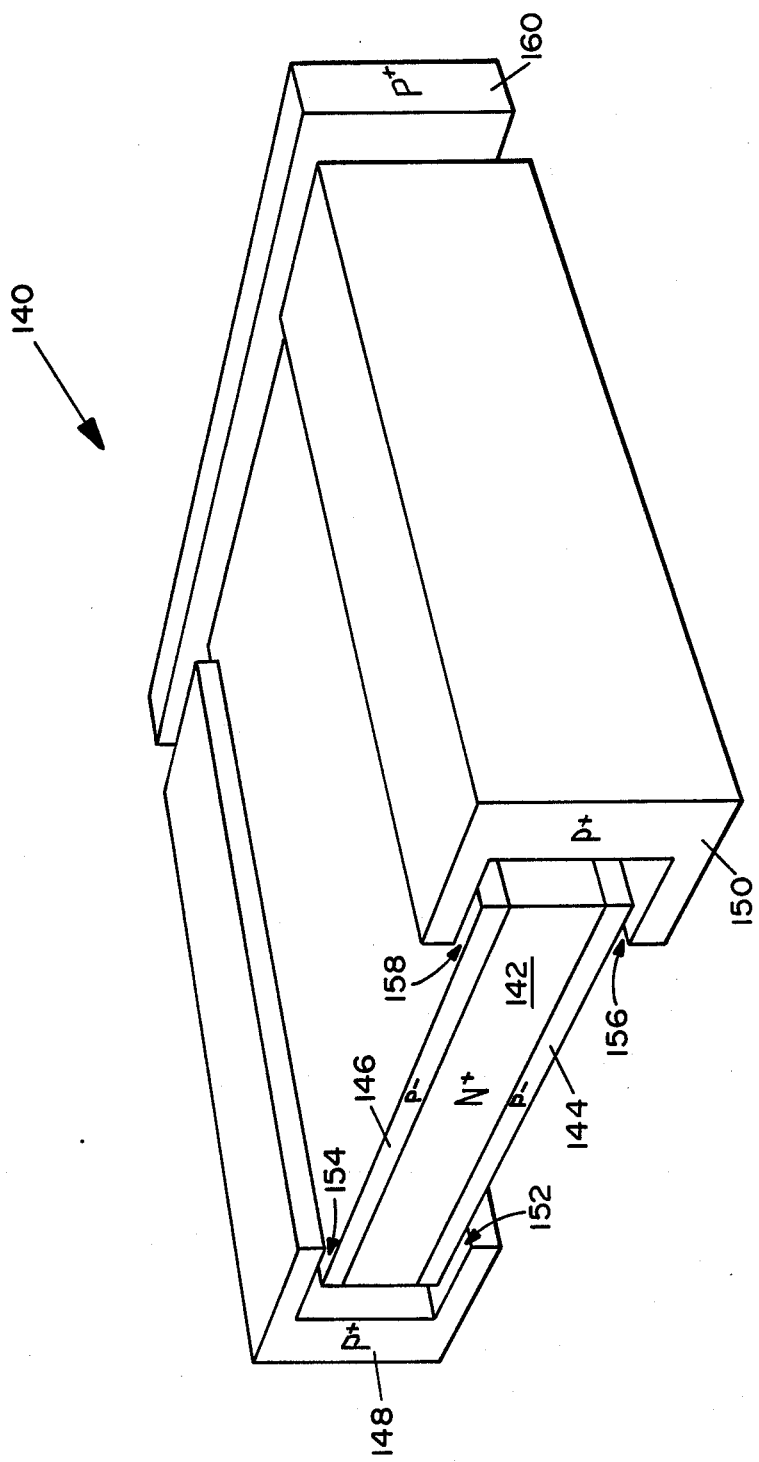
FIG. 8 illustrates orthogonal isolation of a channel edge in an internal-gate device.

FIG. 8 illustrates a perspective view of orthogonal isolation of gate and channel edges in an internal-gate device. An internal-gate JFET 140 includes a gate internal to a channel. The gate 142 is flanked top and bottom by channels 144 and 146. Members 148 and 150 isolate the edges of the gate 142 and channels 144 and 146 accordingly. A plurality of gaps 152, 154, 156, and 158 are provided accordingly. Member 160 connects to the drain ends of the channels. The entire device is surrounded by N− material. The P− regions 144 and 146 and P+ regions 148 and 150 connect to the source. The structure of FIG. 8 is intended to substitute for elements 102 and 104 of FIG. 5 accordingly.

Figure 9:
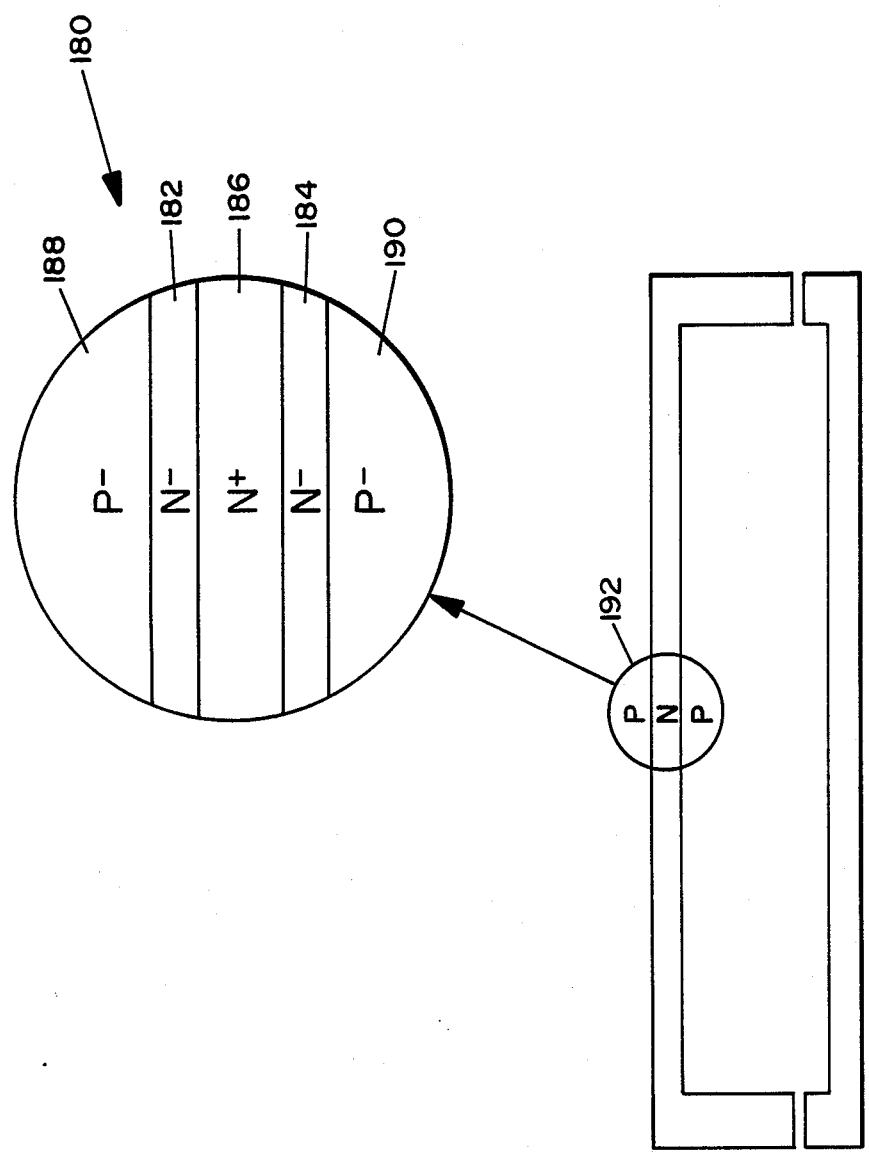
FIG. 9 illustrates a wall-structure variation for diminishing the parasitic capacitance of isolating box junctions; and, FIG. 10 illustrates an all-semiconductor three-dimensional integrated circuit memory (AS3DICM).

FIG. 9 illustrates a cross-sectional view of wall structure variations for diminishing parasitic capacitance of isolating-box junctions. The variation 180 includes additional N− layers 182 and 184 above and below the N+ layer 186. The N− regions are surrounded by P− regions 188 and 190. The variation 180 would be substituted in lieu of the P−, N+, and P− region structures 192. The N− regions reduce capacitance while increasing the thickness of the depletion region. The structure of FIG. 9 is intended to replace elements 56 and 58 of FIG. 3 accordingly.

MODE OF OPERATION

The JFET devices of the present invention are described as within a single-crystal semiconductor monolith containing a three-dimensional doping pattern, and also referred to as an all-semiconductor three-dimensional integrated circuit (AS3DIC). The devices can be utilized as gate-array devices when put into a three-dimensional array. Further, the devices can be used in applicable memory applications accordingly. The devices can also be fabricated from amorphous silicon.

The vertical dimensions of the devices may be much smaller than the lateral dimensions. It is advantageous to route as many interconnections vertically as possible. Consequently, signal-path lengths are reduced and cross-sectional area of the vertical interconnections can be larger than that of the horizontal connections. This, therefore, minimizes the RC time constraints associated with the connection paths.

A typical arrangement would feature cells with a high degree of interconnectivity stacked vertically upon each other, and connected by highly doped semiconductor regions. Long interconnections, as well as global lines, such as for clocks and buses, could be distributed by metal lines on one or more surfaces of the semiconductor monolith. This is in line with the teachings of the all-semiconductor device because the metal occurs only external to the monolith. Metal, of course, must be provided for making connections to external circuitry. Of course, the number of metal-semiconductor interfaces is minimized.

The AS3DIC technology is invaluable for achieving required storage capacity which is attained quite easily. As an example, let the weighted dimensions (weighted to account for peripheral circuitry) of a memory cell be 20 $\mu m \times 20$ $\mu m \times 10$ $\mu m$, with latter being the x or growth direction. This provides $2000 \times 2000 \times 4000 = 16 = 10^9$ cells in a cube 4 cm on the side.

There is more than sheer capacity. Note that, as far as addressing goes, main memories are of the random-access type while the bulk variety is invariably sequential in nature. This simplifies the example considerably.

Figure 10:
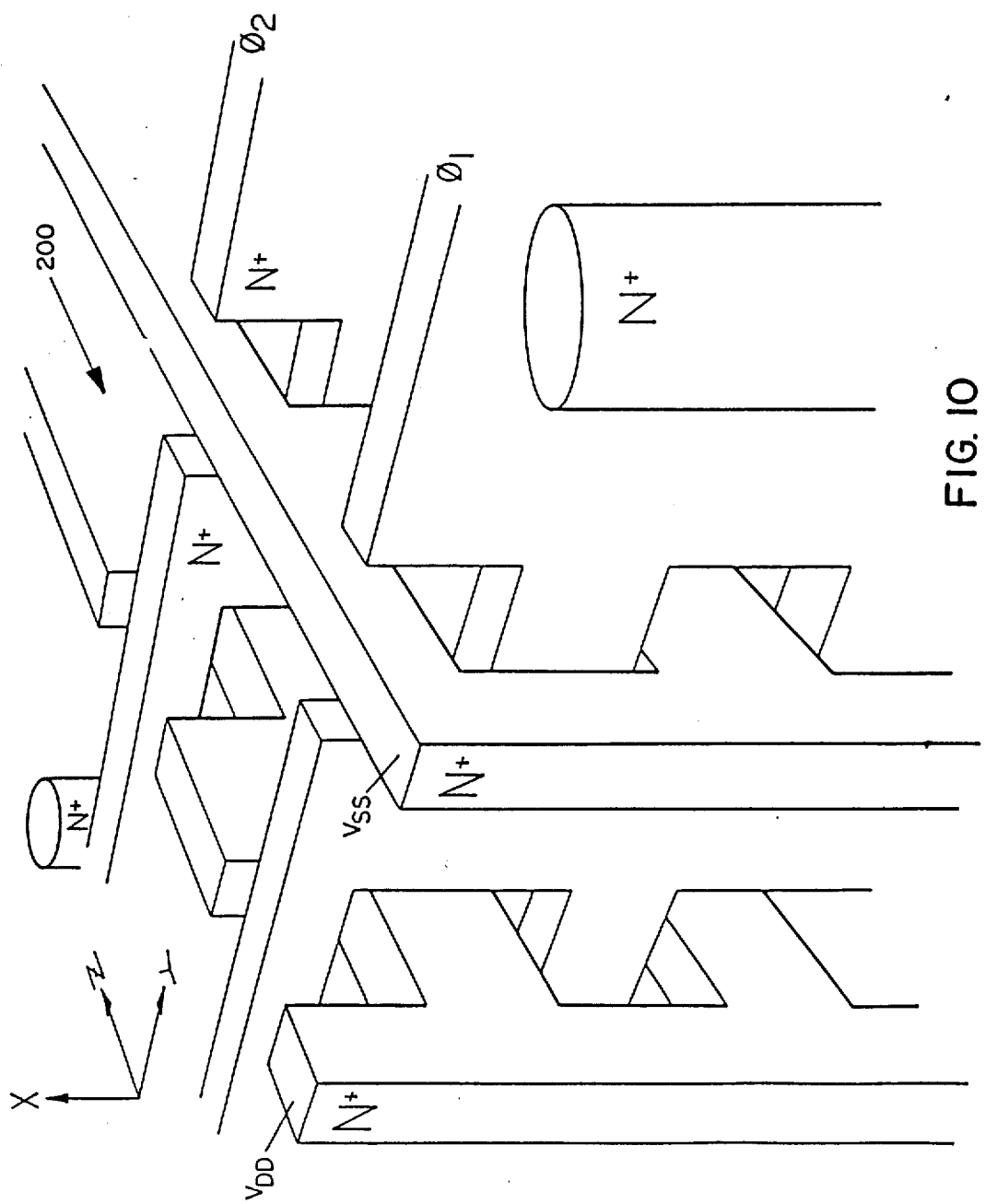

FIG. 10 illustrates a 3-D memory which can be organized as a large array of shift-register pipes with only two supply lines (the lines being actually "planes") and two clock lines (also being "planes"). Looking at an array from the top, as along the X axis in FIG. 10, one sees one plane of cells and the four buses. Naturally, in three dimensions, there need not be any space conflict among the buses.

Another advantage is where speed is very important. Referring to bulk memories, there are two time constants. One corresponds to the rate at which bits are actually read or written. The other called latency gives the average time it takes to access the required sector. Both are shortened by the 3-D implementation to an order-of-magnitude extent, the first because transistors are much faster than their magnetic counterparts, and the second because access to "pipes" is much simpler than access to "sectors" on a disk.

Taking reliability as a further advantage, there is substantial elimination of microphonics. That in itself makes 3-D integrated circuits unique in bulk storage. For airborne applications and, indeed, in any vibration-prone environment, solid state is the preferred structure.

Data are transferred from "bulk" to "main" memory in blocks. That is why sequential access within bulk is perfectly acceptable. While time is associated with the relatively frequent swaps, a substantial reduction accrues from, for example, GaAs 3-D, because of the ability of GaAs to convert electrical to optical energy. The transfer of data from the "bulk" to "main" memory could be direct, the main memory being mounted on the output face of the bulk memory or, such as through fiber-optic links. A structure with a slot for main memory or peripherals to permit optoelectronic transfer of Input and Output can also be provided. The AS3DIC memory converts a maze of circuitry into regular arrays and, thereby, reduces the length and time of travel. This also creates additional naturally intersecting planes for parity checks. The AS3DIC alleviates the problems of resistance and voltage drop in power and signal lines because of facilitating fabrication of thicker elements on one hand while reducing distances measured in numbers of squares or cubes on the other.

The $V_{DD}$, $V_{SS}$, $\phi_1$, and $\phi_2$ "planes" of FIG. 10 can be relatively thick to give low sheet resistance. Any point within the cube is no more than a couple of squares away from any input point. In a two-dimensional IC, it is topologically convenient to check parity in a row and column, and a wrong bit at the intersection of the two can thus be corrected. If multiple errors exist in a row or column, however, such cannot be detected unless parity is also checked in an additional dimension. In 2-D this is difficult. In the AS3DIC, many more physically-aligned-cell directions exist in which parity can be checked.

In a three-dimensional array of all-semiconductor memory cells, the cells can be positioned at sites defined by a space lattice of the crystallographer, which can be by way of example and for purposes of illustration only, but not to be construed as limiting of the present invention, a space lattice of cubic, orthorhombic, monoclinic, triclinic, or other spatial variations thereof. The memory cells provide for checking parity for error detection along lines of physically adjacent cells, where the lines have directions defined by the three primitive vectors of the space lattice involved. This can be pairs such as X-Y, Y-Z, or X-Z, by way of example and for purposes of illustration only. Additional directions of checking for parity can also be undertaken. The memory cells can contain parallel layers of a heavily doped semiconductor of a first conductivity type situated in a more lightly doped matrix of a second conductivity type where regularly positioned perforations or openings in the heavily doped layers provide for passage of other conductors through in other directions, such as illustrated in FIG. 10. The semiconductor bulk-storage medium is faster, smaller, lighter, and less sensitive to environment than the prior electromechanical media.

The memory can be provided with an output face for the mounting of a computer main memory. The memory can also include optoelectronic links for mounting on main memory or peripheral subsystems of the main memory. The memory can also include a processor attached to one face, where the processor may include a small main memory. The memory lends itself to be fabricated as a single unit on an all-semiconductor monolith for totalsystem integration. The memory cell can consist of two E-mode JFET drivers, cross-coupled, and two D-mode JFET loads. The memory cell can also consist of two complementary JFETs, connected to form a negative-resistance pair in series with a load device. The memory can also consist of eight D-mode JFETs and two level-shifting diodes. The memory can also consist of six D-mode JFETs and three voltage-regulating diodes connected in a current-switching configuration.

Various modifications can be made to the present invention without departing from the scope thereof. The use of the term circuit singularly also extends to mean circuits in plural. While E-mode JFET has been used as an example, the principles also extend to D-mode JFET devices. Such an example, the E-mode JFET used as a level shifter could include a thicker channel for higher punch-through voltage where the thicker channel operates as a D-mode JFET.

What we claim is:

1. All-semiconductor three-dimensional integrated circuit comprising:
   a. semiconductor monolith means with no metals or insulators inside;
   b. three-dimensional doping pattern within said monolith means forming at least one buried device, and being junction-isolated;
   c. semiconductor interconnecting signal-path means and power-bus means that are junction-isolated; and,
   d. a three-dimensional JFET with gate and channel regions of opposite conductivity types including at least one channel substantially surrounding at least one gate, thereby forming an internal gate.

2. All-semiconductor three-dimensional integrated circuit comprising:
   a. semiconductor monolith means with no metals or insulators inside;
   b. three-dimensional doping pattern within said monolith means forming at least one buried device, and being junction-isolated;
   c. semiconductor interconnecting signal-path means and power-bus means that are junction-isolated; and,
   d. a three-dimensional JFET with upper and lower gates being common for use as a driver and with gate and channel regions of opposite conducitivity types.

3. All-semiconductor three-dimensional integrated circuit comprising:
   a. semiconductor monolith means with no metals or insulators inside;
   b. three-dimensional doping pattern within said monolith means forming at least one buried device, and being junction-isolated;
   c. semiconductor interconnecting signal-path means and power-bus means that are junction-isolated; and,
   d. at least one three-dimensional JFET wherein the upper and lower gates are independent of each other so that the punch-through voltage from gate to gate yields a constant-voltage I-V characteristic for level shifting, and said JFET having gate and channel regions of opposite conductivity types.

4. All-semiconductor three-dimensional integrated circuit comprising:
   a. semiconductor monolith means with no metals or insulators inside;
   b. three-dimensional doping pattern within said monolith means forming at least one buried device, and being junction-isolated;
   c. semiconductor interconnecting signal-path means and power-bus means that are junction-isolated;
   d. a three-dimensional JFET with gate and channel of opposite conductivity types, including at least one channel substantially surrounding at least one gate, thereby forming and internal gate; and,
   e. means providing orthogonal isolation through one or more normally depleted channel.

5. All-semiconductor three-dimensional integrated circuit comprising:
   a. semiconductor monolith means with no metals or insulators inside;
   b. three-dimensional doping pattern within said monolith means forming at least one buried device, and being junction-isolated;
   c. semiconductor interconnecting signal-path means and power-bus means that are junction-isolated;
   d. a three-dimensional JFET with gate and channel regions of opposite conductivity types, including at least one channel substantially surrounding at least one gate, thereby forming an internal gate;
   e. means providing orthogonal isolation through one or more normally depleted channel; and,
   f. at least one floating element means in said normally depleted channel of said orthogonal isolator.

6. All-semiconductor three-dimensional integrated circuit comprising:
   a. semiconductor monolith means with no metals or insulators inside;
   b. three-dimensional doping pattern within said monolith means forming at least one buried device, and being junction-isolated;
   c. semiconductor interconnecting signal-path means and power-bus means that are junction-isolated;
   d. a three-dimensional JFET with gate and channel regions of opposite conductivity types, and with upper and lower gates being common for use as a driver; and,
   e. isolating box means of first conductivity type material substantially surrounding said device means, said box being fully separated into two parts by a layer of a second conductivity type material that is substantially thin and lightly doped, that said layer is normally fully depleted, thereby achieving electrical isolation of said second conductivity type material inside said box from said second conductivity type material outside said box.

7. All-semiconductor three-dimensional integrated circuit comprising:
   a. semiconductor monolith means with no metals or insulators inside;
   b. three-dimensional doping pattern within said monolith means forming at least one buried device, and being junction-isolated;
   c. semiconductor interconnecting signal-path means and power-bus means that are junction-isolated;
   d. a three-dimensional JFET with gate and channel regions of opposite conductivity types, and with upper and lower gates being common for use as a driver;
   e. isolating box means of first conductivity type material substantially surrounding said device means, said box being fully separated into two parts by a layer of a second conductivity type material that is substantially thin and lightly doped, that said layer is normally fully depleted, thereby achieving electrical isolation of said second conductivity type material inside said box from said second conductivity type material outside said box; and,
   f. said isolating-box means including at least one element between said parts of said box and extending about a periphery of said box means thereby providing a direct connection of said element inside said box means to an element outside of said box means.

8. All-semiconductor three-dimensional integrated circuit comprising:
   a. semiconductor monolith means with no metals or insulators inside;

b. three-dimensional doping pattern within said monolith means forming at least one buried device, and being junction-isolated;

c. semiconductor interconnecting signal-path means and power-bus means that are junction-isolated;

d. said buried device in at least one case being a three-dimensional JFET with gate and channel regions of opposite conductivity types, and including internal-gate means; and, e. said internal gate including thin and lightly doped edges for inherent edge isolation.

9. All-semiconductor three-dimensional integrated circuit comprising:

a. semiconductor monolith means with no metals or insulators inside;

b. three-dimensional doping pattern within said monolith means forming at least one buried device, and being junction-isolated;

c. semiconductor interconnecting signal-path means and power-bus means that are junction-isolated;

d. said buried device in at least one case being a three-dimensional JFET with gate and channel regions of opposite conductivity types, and including internal-gate means; and, e. edge isolation means for said internal-gate means, comprising a gate region between two channel regions, U-shaped regions of the same material as said channel regions, said U-shaped regions wrapped around side edges of said channel-gate structure for orthogonally isolating said gate region from a surrounding matrix, thereby enabling said gate to modulate conductivity of said channel.

10. All-semiconductor three-dimensional integrated circuit comprising:

a. single-crystal semiconductor monolith means with no metals or insulators inside;

b. three-dimensional doping pattern within said monolith means forming at least one buried device, and being junction-isolated;

c. semiconductor interconnecting signal-path means and power-bus means that are junction-isolated; and, d. at least one high-conductivity interconnection placed within other opposite-type conductive interconnection, all of said connections buried in said monolith means.

11. All-semiconductor three-dimensional integrated circuit comprising:

a. means of at least one semiconductor circuit, including at least one active device;

b. means entirely surrounding said circuit with a semiconductor matrix in a three-dimensional space about said semiconductor means;

c. said semiconductor circuit in at least one case directly connected only to other circuits that are similarly surrounded by said semiconductor matrix means, and said semiconductor circuit not directly connected through a nodeless path to a free surface of said semiconductor matrix;

d. said integrated circuit comprising an array of memory cells; and, e. at least one of said memory cells comprising two complementary JFETs connected to form a negative-resistance pair in series with a load device with each JFET device having gate and channel regions of opposite conductivity types.

12. All-semiconductor three-dimensional integrated circuit comprising parallel layers of heavily doped semiconductor of a first conductivity type, positioned in a more lightly doped matrix of a second conductivity type, and including regularly positioned perforations in said heavily doped layer providing passage of conductors through said layers in other directions.

13. Integrated circuit of claim 12 wherein said matrix includes heavily doped same-type regions to minimize overall resistance.

14. All-semiconductor three-dimensional integrated circuit comprising:

a. single-crystal semiconductor monolith means with no metals or insulators inside;

b. three-dimensional doping pattern within said monolith means forming at least one buried device, and being junction-isolated;

c. semiconductor interconnecting signal-path means and power-bus means that are junction-isolated; and, d. an isolating-box means of first conductivity type material surrounding said device means, said box being fully separated into two parts by a layer of a second conductivity type material that is substantially thin and lightly doped, that said layer is normally fully depleted, thereby achieving electrical isolation of said second conductivity type material inside said box from said second conductivity type material outside said box.

15. Integrated circuit of claim 14 including at least one element between said parts and extending about a periphery of said box means thereby providing a direct connection of said element inside said box means to an element outside of said box means.

16. All-semiconductor three-dimensional integrated circuit comprising:

a. single-crystal semiconductor monolith means with no metals or insulators inside;

b. three-dimensional doping pattern within said monolith means forming at least one buried device, and being junction-isolated;

c. semiconductor interconnecting signal paths means and power buses means which are junction-isolated;

d. semiconductor structure including internal-gate means; and, e. edge isolation means for a gate between two channel regions, U-shaped regions of the same material as said channel regions, said U-shaped regions wrapped around side edges of said channel-gate structure for orthogonally isolating said gate region from a surrounding matrix, thereby enabling said gate to modulate conductivity of said channel.

17. All-semiconductor three-dimensional integrated circuit comprising:

a. means of at least one semiconductor circuit, including at least one active device;

b. means entirely surrounding said circuit with a semiconductor matrix in a three-dimensional space about said semiconductor means; and, c. isolating-box means substantially surrounding said active device means.

18. All semiconductor three-dimensional integral circuit structure comprising:

a. means of at least one semiconductor circuit, including at least one active device; and, b. means entirely surrounding said circuit with a semiconductor matrix in a three-dimensional space about said semiconductor means, said surrounding means providing a box interrupted by at least one oppositely doped layer with a profile normal to a growth axis such that depletion layers associated with the two PN junctions that define said oppositely doped layer substantially touch each other when said junctions are at equilibrium.

19. Integrated circuit of claim 17 fabricated by a continuous process.

20. Integrated circuit of claim 17 comprising metal-semiconductor contact means only at outer surfaces of said monolith means.

21. Integrated circuit of claim 1 wherein doped region include a plurality of closely spaced planes of dopant atoms, each of said planes having an areal density of dopant atoms that is appreciably smaller than the density of atoms in one crystalline monolayer.

22. Integrated circuit of claim 3 wherein all critical dimensions are normal to the growth axis.

23. Integrated circuit of claim 17 including tunnel junction means providing ohmic interconnections from N-type to P-type regions.

24. All-semiconductor three-dimensional integrated circuit comprising:
 a. means of at least one semiconductor circuit, including at least one active device;
 b. means entirely surrounding said circuit with a semiconductor matrix in a three-dimensional space about said semiconductor means;
 c. said semiconductor circuit in at least one case directly connected only to other circuits that are similarly surrounded by said semiconductor matrix means, and said semiconductor circuit not directly connected through a nodeless path to a free surface of said semiconductor matrix;
 d said integrated circuit comprising an array of memory cells; and,
 e. at least one of said memory cells comprising two E-mode JFET drivers, cross-coupled and two D-mode JFET load with each JFET device having gate and channel regions of opposite conductivity types.

* * * * *

UNITED STATES PATENT AND TRADEMARK OFFICE
CERTIFICATE OF CORRECTION

PATENT NO. : 4,794,442

DATED : December 27, 1988

INVENTOR(S) : Raymond M. Warner, Jr., et al.

It is certified that error appears in the above—identified patent and that said Letters Patent is hereby corrected as shown below:

On the Title Page Assignee should read

-- "Assignee: Regents of the University of Minnesota". --.

On the Title Page, "26 Claims, 9 Drawing Sheets" should read -- 26 Claims 10 Drawing Sheets --

The sheet of Drawing consisting of Fig. 10, should appear as shown on the attached sheet.

Column 3, line 3, change "access" to --axis--.

Column 5, line 50, change "phenomena" to --phenomenon--; and delete "by E-mode devices".

Column 9, line 62, delete "and" and insert --an--.

Column 13, line 12, change "include" to --includes--.

Signed and Sealed this

Thirteenth Day of March, 1990

Attest:

JEFFREY M. SAMUELS

*Attesting Officer*  *Acting Commissioner of Patents and Trademarks*